US006641675B2

(12) United States Patent
Dryer et al.

(10) Patent No.: US 6,641,675 B2
(45) Date of Patent: *Nov. 4, 2003

(54) METHOD AND APPARATUS FOR IMMERSION TREATMENT OF SEMICONDUCTOR AND OTHER DEVICES

(75) Inventors: Paul William Dryer, Gilbert, AZ (US); Richard Scott Tirendi, Phoenix, AZ (US); James Bradley Sundin, Chandler, AZ (US)

(73) Assignee: Z Cap, L.L.C., Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/865,875

(22) Filed: May 25, 2001

(65) Prior Publication Data

US 2001/0023700 A1 Sep. 27, 2001

Related U.S. Application Data

(62) Division of application No. 09/614,502, filed on Jul. 11, 2000, now Pat. No. 6,284,055, which is a division of application No. 09/442,574, filed on Nov. 18, 1999, now Pat. No. 6,244,280, which is a division of application No. 09/106,066, filed on Jun. 29, 1998, now Pat. No. 6,021,791.

(51) Int. Cl.[7] .............................................. B08B 7/04
(52) U.S. Cl. ................................ 134/1; 134/1.3; 134/3; 134/10; 134/25.4; 134/28; 134/30; 134/902
(58) Field of Search .................... 134/1, 1.3, 2, 3, 134/10, 902, 26, 28, 30, 34, 25.4, 110, 111

(56) References Cited

U.S. PATENT DOCUMENTS

| | | | |
|---|---|---|---|
| 4,899,767 A | * | 2/1990 | McConnell et al. ...... 134/102.2 |
| 4,990,260 A | | 2/1991 | Pisani ........................ 210/664 |
| 5,069,235 A | * | 12/1991 | Vetter et al. ................. 134/113 |
| 5,175,124 A | | 12/1992 | Winebarge .................. 437/180 |
| 5,301,701 A | | 4/1994 | Nafziger ..................... 134/95.2 |
| 5,336,371 A | | 8/1994 | Chung et al. ............. 156/659.1 |
| 5,409,613 A | | 4/1995 | Weaver ....................... 210/651 |
| 5,415,191 A | | 5/1995 | Mashimo et al. ........ 134/102.1 |
| 5,419,351 A | | 5/1995 | Ciari ........................... 134/105 |

(List continued on next page.)

FOREIGN PATENT DOCUMENTS

| | | |
|---|---|---|
| EP | 0 2997 247 | 8/1992 |
| EP | 0 740 329 A1 | 10/1996 |
| EP | 0 788 143 A2 | 8/1997 |
| JP | 3-30329 | 2/1991 |
| JP | 3-44927 | 2/1991 |
| JP | 3-191523 | 8/1991 |

OTHER PUBLICATIONS

Assembly Data Sheet for PALL Separel EFM–530 Degasification Module (undated).

Advertisement entitled "AT&T Ultrapure Water Deaerated Using Liqui–Cel Extra–Flow Membrane Contactors" (undated).

*Primary Examiner*—Alexander Markoff
(74) *Attorney, Agent, or Firm*—Jeffrey D. Moy; Harry M. Weiss; Weiss, Moy & Harris, P.C.

(57) ABSTRACT

Method and apparatus for cleaning semiconductor devices and other workpieces using an aqueous rinse solution which is de-oxygenated by passing the aqueous rinse solution and a carrier gas through an osmotic membrane degasifier. A cleaning chamber is also disclosed for carrying out the cleaning method.

47 Claims, 5 Drawing Sheets

U.S. PATENT DOCUMENTS

| | | | |
|---|---|---|---|
| 5,451,291 A | 9/1995 | Park et al. | 156/644.1 |
| 5,518,624 A | 5/1996 | Filson et al. | 210/651 |
| 5,578,193 A | 11/1996 | Aoki et al. | 205/746 |
| 5,593,538 A | 1/1997 | Davison et al. | 156/637.1 |
| 5,651,894 A | 7/1997 | Boyce et al. | 210/652 |
| 5,674,410 A | 10/1997 | Nakajima et al. | 216/92 |
| 5,695,545 A | 12/1997 | Cho et al. | 95/46 |
| 5,720,869 A | 2/1998 | Yamanaka et al. | 205/701 |
| 5,725,753 A | 3/1998 | Harada et al. | 205/746 |
| 5,727,332 A | 3/1998 | Thrasher et al. | 34/277 |
| 5,800,626 A | 9/1998 | Cohen et al. | 134/1.3 |
| 5,833,846 A | 11/1998 | Tanabe et al. | 210/202 |
| 5,938,922 A | 8/1999 | Fulk, Jr. et al. | 219/321.81 |
| 6,001,189 A * | 12/1999 | Rolfson | 134/10 |
| 6,021,791 A * | 2/2000 | Dryer et al. | 134/100.1 |
| 6,146,468 A * | 11/2000 | Dryer et al. | 134/10 |
| 6,187,216 B1 * | 2/2001 | Dryer et al. | 216/95 |
| 6,244,055 B1 * | 6/2001 | Hanson et al. | 62/149 |
| 6,244,280 B1 * | 6/2001 | Dryer et al. | 134/100.1 |

\* cited by examiner

METHOD AND APPARATUS FOR IMMERSION TREATMENT OF SEMICONDUCTOR AND OTHER DEVICES

CROSS-REFERENCE TO RELATED APPLICATIONS

This is a divisional of patent application Ser. No. 09/614,502, filed Jul. 11, 2000 now U.S. Pat. No. 6,284,055, which is a divisional of patent application Ser. No. 09/442,574, filed Nov. 18, 1999 now U.S. Pat. No. 6,244,280, which is a divisional of patent application Ser. No. 09/106,066, filed Jun. 29, 1998 now U.S. Pat. No. 6,021,791.

BACKGROUND OF THE INVENTION

1. Field of the Invention

The present invention pertains to the aqueous processing of various articles, including the immersion cleaning of semiconductor wafers, using deoxygenated aqueous rinse solutions.

2. Description of the Related Art

As will be seen herein, the present invention is directed to the aqueous treatment of a wide variety of commercially important articles, such as liquid crystal displays, flat panel displays, memory storage disk substrates, as well as photographic plates and film. The present invention has found immediate commercial acceptance in the field of semiconductor wafers, especially wafers of a type which are ultimately divided to form a plurality of electronic devices.

During the course of producing commercial semiconductor wafers, layers of various materials are built up on one surface of a wafer blank. These various layers are processed using several different etching techniques, each of which results in a residue which impairs further device fabrication. It is important that such residues be effectively removed. Typically, the several types of residue are removed with solvents especially adapted for the particular residues. While such solvents are generally effective for removing residues, solvents remaining on the surfaces of the semiconductor device also impair further device fabrication steps.

Accordingly, it is important that the solvents be removed from the semiconductor device and it is known that water rinsing is an efficient means of solvent removal. However, semiconductor device layer materials have changed over the years, and presently semiconductor device manufacturers are employing materials which are subject to corrosion upon contact with water. In an effort to reduce the corrosion problem, carbon dioxide gas has been sparged, i.e., bubbled, into the rinse water to partially lower the pH of the rinse water. However, bubbling carbon dioxide into water rinses used in the semiconductor device fabrication industry has proven to be only marginally successful in reducing the extent of corrosion, and further adds the risk of introducing contaminating particles into solution. In an effort to overcome growing problems of corrosion, the semiconductor device fabrication industry has investigated intermediate rinse steps using non-aqueous rinse solutions. However, such non-aqueous solutions have proven to be less effective than rinse water in removing solvents and wafers are still routinely rinsed with water, despite the corrosion effects.

Significant efforts have been expended in reducing the amount of exposure of a wafer containing alloys of copper and aluminum to rinse water. However, it appears that, in order to meet future requirements for improved electrical performance, the aluminum content of the alloy must be substantially reduced and possibly eliminated, thus substantially increasing the susceptibility of the wafer layer materials to corrosion, at higher levels than those presently experienced.

One example of efforts to improve wafer production involves oxygen removal to reduce oxide growth on the surface of semiconductor wafers. For example, literature describing the PALL SEPAREL Model EFM-530 Degasification Module addresses the reduction of dissolved oxygen in deionized water, in a manner which avoids potential defects to semiconductor devices caused by the formation of unwanted oxide layers. As is known in the art, an oxide layer forms when pure silicon is exposed to an oxygen source, such as dissolved oxygen in a rinse water or other aqueous medium. The oxide layer can change the surface of the silicon from hydrophobic to hydrophilic, a condition which is undesirable in some aspects of wafer processing, such as pre-diffusion cleaning operations. Accordingly, the PALL Degasification Module addresses the need to deoxygenate rinse water to avoid formation of a silicon dioxide layer in the rinse after the wafer is treated with an HF etch solution. As can be seen, the problem addressed by the PALL Degasification Module is not related to problems encountered in controlling corrosion of aluminum, such as pitting and etching, as has been experienced in processing wafers carrying copper/aluminum structures on their surface. While dissolved oxygen is also objectionable from a corrosion standpoint, the corrosion problem is not concerned with the formation of unwanted oxides. A further, more complete system control over wafer processing so as to reduce corrosion in wafers containing copper/aluminum structures is needed.

SUMMARY OF THE INVENTION

It is an object of the present invention to provide cleaning for semiconductor wafers using aqueous solutions which are treated in a manner to eliminate corrosion of semiconductor device materials layered on semiconductor substrates.

Another object of the present invention is to provide cleaning of the above-described type which is effective even in relatively small, hollow structures formed in a semiconductor surface, such as vias.

A further object of the present invention is to provide aqueous treatment of the type described above which removes dissolved oxygen from an aqueous solution while controlling the pH of the aqueous solution.

Another object of the present invention is to provide arrangements for aqueous treatment of many different types of devices using conventional readily obtained equipment, and consumables which are relatively inexpensive.

Yet another object of the present invention is to provide process arrangements of the type described above by employing an osmotic membrane degasifier and using a carrier fluid (preferably a gas) comprised of one or more components, preferably for oxygen removal and, optionally, pH control or other chemical adjustment to the aqueous solutions.

These and other objects according to principles of the present invention are provided in apparatus for processing a workpiece, comprising:

a cleaning chamber defining a cavity for receiving the workpiece and a device opening through which said workpiece is passed into and out of the cavity;

an osmotic membrane degasifier defining a degasifier cavity, a membrane dividing the degasifier cavity into first and second parts, a aqueous solution inlet and a aqueous solution outlet associated with said first part to direct aqueous solution into contact with one side of the membrane, and a carrier gas inlet and a carrier gas outlet associated with said second part to direct carrier gas into contact with the other side of the membrane; and the aqueous solution outlet coupled to the cleaning chamber.

DETAILED DESCRIPTION OF THE PREFERRED EMBODIMENT

Figure 1:
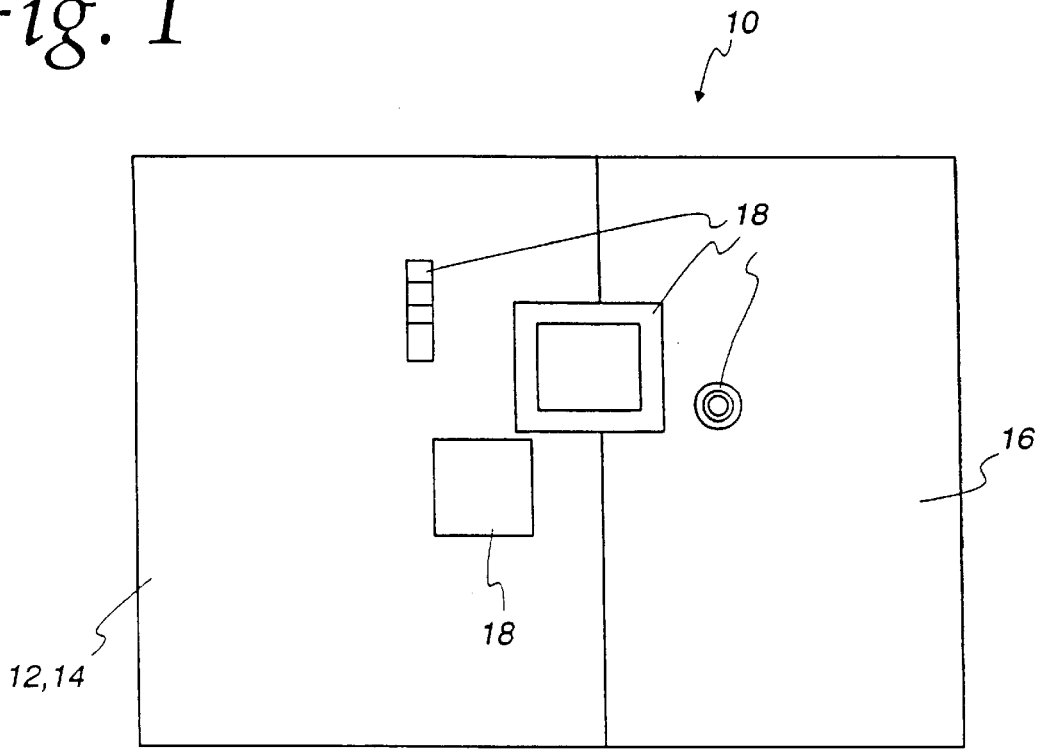
FIG. 1 is a front elevational view of cleaning apparatus according to principles of the present invention.

As mentioned above, the present invention has found immediate application in the field of semiconductor device fabrication. However, in providing methods and apparatus for carrying out controlled immersion processing operations as well as providing deoxidized and/or pH-controlled aqueous solutions, the present invention is readily adaptable to a wide range of commercially significant activities, such as the photographic processing of plates, films and prints, and the fabrication of liquid crystal and flat panel displays, as well as articles requiring highly refined surface finishes, such as hard disk memory substrates. As will be seen below, the present invention will be described with reference to the processing of semiconductor wafers, although it will become readily apparent to those skilled in the art that other types of workpieces other than semiconductor wafers and immersion processing other than aqueous cleaning and/or rinsing of semiconductor wafers is also encompassed within the scope of the present invention.

Semiconductor wafers are typically fabricated by forming a layered series of devices integrated with an underlying semiconductor blank or so-called "prime wafer". With the formation of each layer, the wafer in process must be polished and cleaned in preparation for the next layering step. With ongoing changes in layer materials, new, challenging processing problems have arisen. In general, the unit cost of individual wafers is increasing dramatically and, accordingly, even partial losses of wafers being processed result in an expensive penalty for the wafer fabricator. Unwanted materials, such as contamination particles and residues associated with via etching or metal etching processes, can cause subsequent layering operations to fail. Such residues and contamination particles associated therewith are typically removed using various solvents. The solvents are then removed with one or more rinse solutions, and the present invention has found immediate acceptance in providing aqueous solutions (i.e., solutions whose composition is either exclusively or predominantly comprised of water) for use in such cleaning and especially in rinsing operations.

Increasing use is being made of device layer materials (such as aluminum/copper alloys and proposed all-copper structures) which have greater susceptibilities to corrosion when exposed to water rinses. However, as is widely recognized, there are strong advantages in employing aqueous solutions for wafer rinse. For example, compared to non-aqueous rinses (i.e., rinses not predominantly comprised of water), such as isopropyl alcohol (IPA) or N-methyl pyrrolidone (NMP), aqueous rinse solutions require less investment cost, less safety precautions, are more affordable to dispose of when their useful life has expired, and for many types of popular solvents, aqueous solutions are the most effective rinsing agents for cleaning the wafer surfaces being processed.

In developing the present invention, consideration was given to the corrosion mechanisms typically encountered in semiconductor wafer processing. For example, the corrosion of aluminum was studied with reference to the following oxidation/reduction reactions:

$$4Al \rightarrow 4Al^{3+} + 12e^- \quad \text{(Equation 1)}$$

$$6H_2O + 3O_2 + 12e^- \rightarrow 12OH^- \quad \text{(Equation 2)}$$

$$4Al + 3O_2 + 6H_2O \rightarrow 4Al(OH)_3 \quad \text{(Equation 3)}$$

$$4Al(OH)_3 \rightarrow 2Al_2O_3 + 6H_2O \quad \text{(Equation 4)}$$

Equations 1 and 2 describe the reactions driving the formation of corrosion and corrosion by-products reflected in Equations 3 and 4. As will be seen herein, the approach of the present invention is to remove the oxygen reactant. Further, it is observed that the corrosion rates are affected by the pH of the aqueous solution. One objective of the present invention is to combine both pH control and oxygen removal to form a combined one-step treatment of the aqueous solution brought in contact with the wafers being processed.

Figure 2:
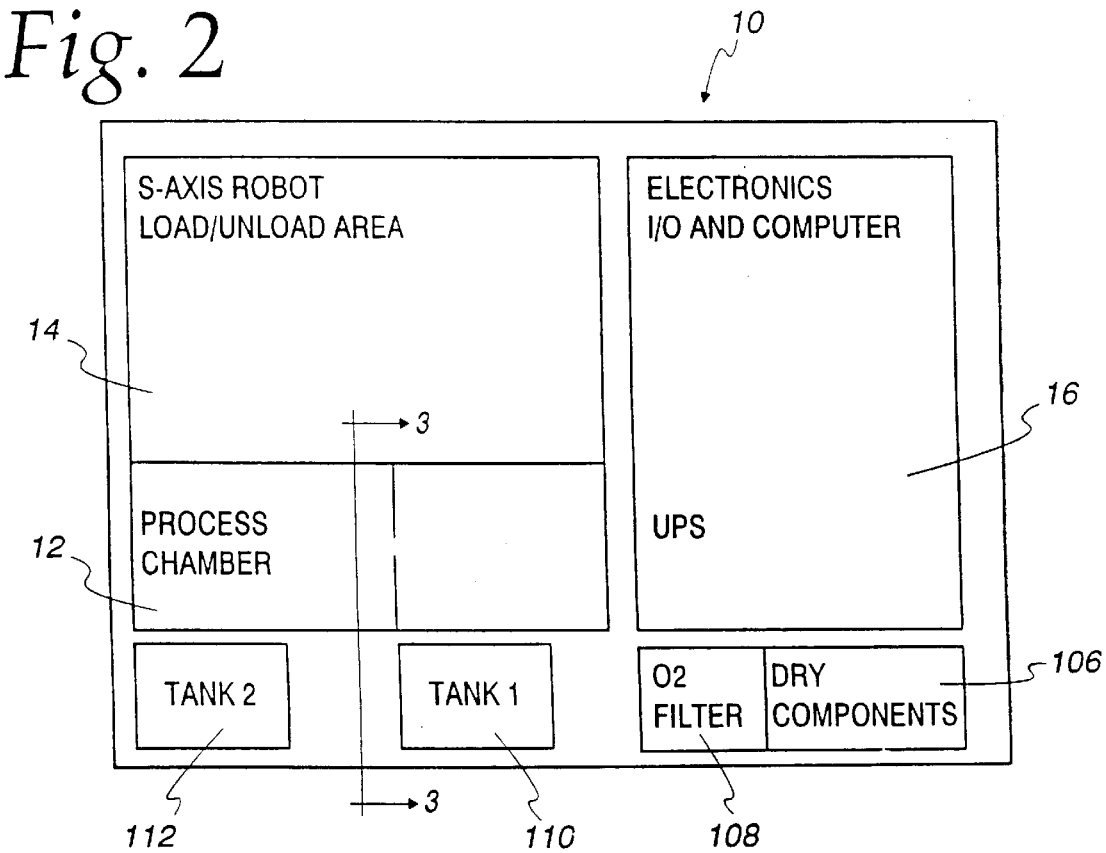
FIG. 2 is a schematic plan view thereof.

Referring now to FIGS. 1 and 2, a wafer treatment apparatus according to principles of the present invention is generally indicated at 10. Apparatus 10 includes a process chamber 12 surrounded by related equipment, to form a practical wafer-treating operation. As can be seen in FIG. 2, a robot load/unload area 14 is located adjacent or above the process chamber and includes conventional robotic placement equipment (not shown) for inserting and removing semiconductor wafers from process chamber 12. Reference numeral 16 is directed to a portion of wafer treatment apparatus 10 which includes an uninterruptable power supply (UPS) and control means, including a computer, and electronics input/output capability which is accessed by switches and other controls 18 located on the outside of the enclosure cabinet, as can be seen, for example, in FIG. 1.

Figure 3:
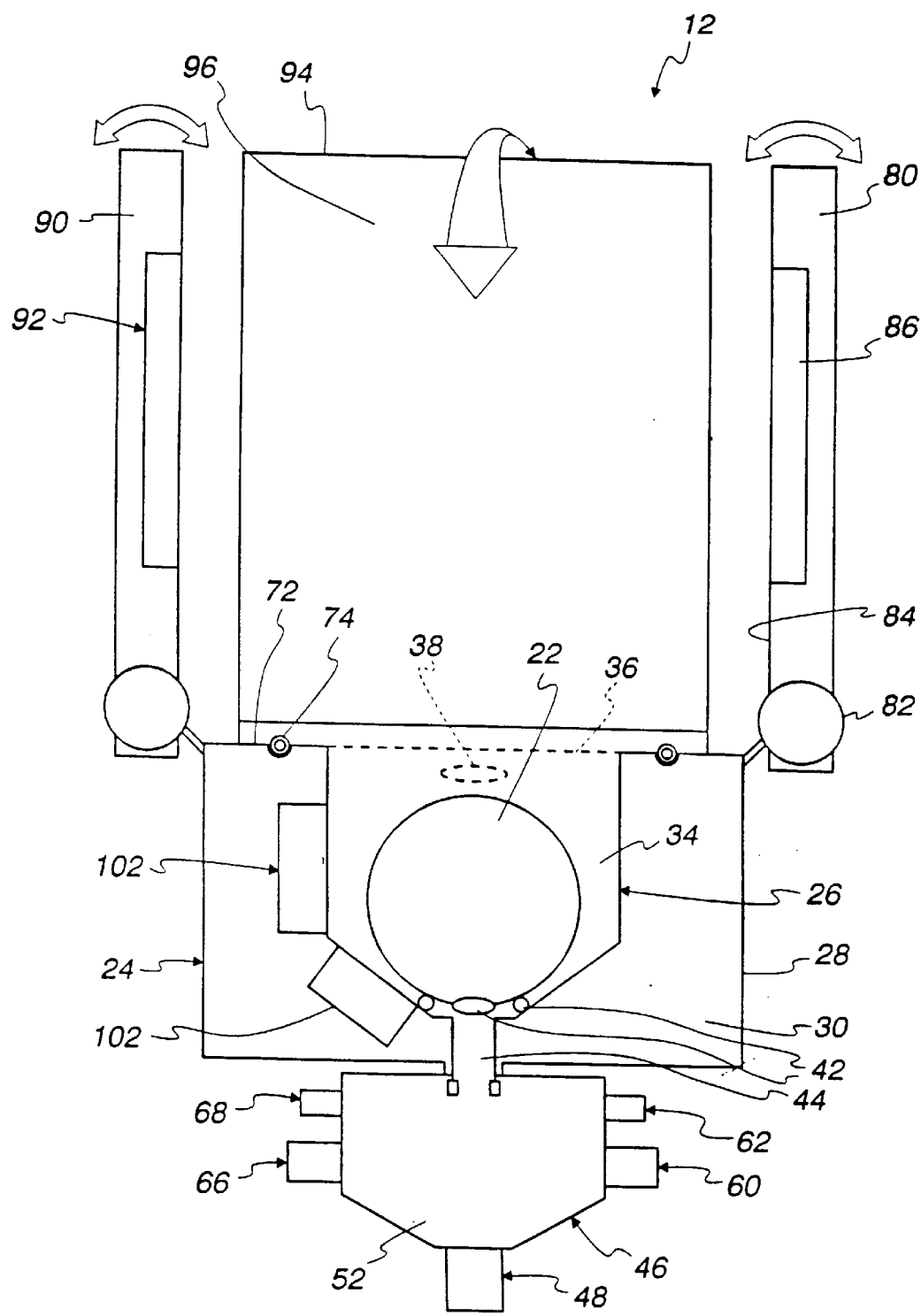
FIG. 3 is a cross-sectional view taken along the line 3—3 of FIG. 2.

Turning now to FIG. 3, the process chamber 12 is shown in greater detail. Although different processes can be carried out with chamber 12, it has found immediate application for immersion cleaning (including rinsing and drying) of semiconductor wafers, such as wafer 22 shown in FIG. 3. Chamber 12 includes a body generally indicated at 24 comprising a receptacle 26 and an outer, surrounding enclosure 28. Body 24 defines a hollow interior 30 which preferably is hermetically sealed and exhausted to a suitable control system.

Receptacle 26 is preferably made of quartz material or other non-reactive material and is formed to define a wafer-receiving cavity 34 having an upper opening 36 through which wafers or other workpieces pass as they are inserted and removed from cavity 34. A weir opening 38 is formed adjacent the upper end of receptacle 26 and directs overflow in a manner to be described below with reference to the schematic diagram of FIG. 4. One or more wafers 22 are supported at their bottom edge on furniture or support members 42 located adjacent a passageway 44 communicating with a plenum 46 which is located beneath body 24. A fast drain valve 48 is located at the lower end of plenum 46.

As can be seen in FIG. 3, passageway 44 connects cavity 34 with an interior volume 52 of plenum 46. A fast flow valve 60 and a slow flow valve 62 communicate with interior 52 and are operated to fill plenum 46 with an aqueous medium, preferably deionized water treated in a manner to be described herein. Also coupled to the interior 52 of plenum 46 is a fast flow valve 66 and a slow flow valve 68, used to fill plenum 46 with a chemical, such as solvents or a non-aqueous rinse solution, such as isopropyl alcohol (IPA). In operation, plenum 46 is first filled with a desired solution, with the level eventually rising past passageway 44 to enter cavity 34. The liquid level may be maintained within quartz receptacle 26 at any step of a process or may intentionally cause overflow to pass through overflow weir 38. Preferably, workpieces and solutions within receptacle 26 are excited by conventional means, such as sonic, preferably ultrasonic or megasonic transducers 102, to enhance the cleaning or other processing operations.

An upper wall 72 of body 24 includes a recess for a conventional sealing gasket 74. A plurality of lids, preferably two lids and most preferably three lids, are hingedly joined to body 24 adjacent upper surface 72 and are selectively movable, one at a time, to sealingly enclose the upper end 36 of receptacle 26. As will be seen herein, each lid is operable to enclose cavity 34 to provide a wide range of environments within the receptacle cavity. For example, processing lid 80 hingedly connected at 82 to body 24 is closed during cleaning or other processing of wafer 22. In order to prevent condensation on the lid inner surface 84, lid 80 is provided with a blanket heater 86. It is generally preferred that the lid 80 confine a pressurized gas blanket on top of the liquid surface within cavity 34. The gas blanket is introduced into the cavity by conventional nozzle means in the process lid or cavity wall. The gas blanket can be comprised of a suitable non-reactive purge gas, such as nitrogen, or, if desired, can be comprised of carbon dioxide so as to provide additional pH control if the liquid surface within cavity 34 is broken, as during a rapid cavity-filling operation. Optionally, the processing lid 80 can include apparatus for purging ambient environment from cavity 34 preparatory to a processing operation.

Drying lid 90 is lowered to engage gasket 74 and enclose upper opening 36 of cavity 34 during wafer drying operations. Lid 90 preferably includes conventional wafer drying equipment of the "MARANGONI" or surface tension gradient drying type, but other types of drying apparatus, such as heat lamps, super heated vapor, or spin drying can also be used. One example of drying lid 90 is given in U.S. Pat. No. 5,634,978, the disclosure of which is incorporated by reference as if fully set forth herein.

The preferred lid 90 includes an assembly 92 of nozzles injecting a final rinse solution, preferably one having a relatively low vapor pressure, such as isopropyl alcohol, and a heated inert drying medium, such as nitrogen gas. A third, load lid 94 is used during load/unload operations and includes an inner surface on which wafer cassettes, carriers or other load/unload equipment may be temporarily placed. However, if working surfaces are otherwise provided, or if sufficiently capable robotic equipment is used for loading and unloading, lid 94 may be rendered unnecessary and can be omitted, if desired.

Referring again to FIG. 2, various components associated with the drying equipment located in assembly 92 are identified in FIG. 2 by reference numeral 106. The components 106 are coupled by means not shown, to assembly 92 in lid 90. As mentioned, valves 60, 62 introduce aqueous media into receptacle 26. In order to provide improved control over oxidation reactions with layered, copper-bearing structures carried on wafer 22, the aqueous media in contact with wafer 22 is, according to one aspect of the present invention, treated by an oxygen filter in the form of an osmotic membrane degasifier indicated by reference numeral 108 in FIG. 2. The aqueous media (preferably conventional deionized water) is passed over a semi-permeable membrane, such as membranes available from Hoechst Celanese for use with their LIQUI-CEL Membrane Degasifier, the osmotic membrane degasifier preferred in carrying out the present invention. Similar osmotic membrane degasifiers may also be commercially obtained from Pall Corporation of East Hills, N.Y., under the trade designation "SEPAREL" and W. L. Gore & Assoc. in Elkton, Md. under the trade designation "DISSOLVE".

The aqueous media is passed over one side of the semi-permeable membrane in degasifier 108 while a carrier fluid, preferably a gas at a pre-selected temperature and pressure, is caused to flow over the opposite side of the semi-permeable membrane. The preferred carrier gas, according to the principles of the present invention, may be comprised of one or more components and preferably carries out several purposes. First, the carrier gas "carries" or "pulls" dissolved oxygen from the aqueous media being treated. Thus, oxygen (or other dissolved gas) from the aqueous media is made to selectively diffuse across the semi-permeable membrane so as to enter the carrier gas stream located on the opposite side of the membrane. Preferably, the flow of carrier gas is set so as to maintain the highest practical diffusion rate across the membrane, preventing oxygen levels on the carrier gas side of the membrane from reaching equilibrium with the carrier gas.

Optionally, the carrier gas is selected for its ability to diffuse in a reverse direction across the semi-permeable membrane, so as to quiescently inject beneficial additives into solution in the aqueous media. Most preferably, the carrier gas is selected such that, upon dissolving in the aqueous media it will act to alter the aqueous media pH value in a manner which further precludes corrosion of the wafer structures. The preferred carrier gas of the present invention comprises a mixture of two gases, one for causing dissolved oxygen in the aqueous media to flow across the osmotic membrane and the second to alter the pH value when introduced into the aqueous media. The first component can be comprised of virtually any gas or liquid other than oxygen so as to create the desired osmotic pressure across the membrane, and the second component most preferably comprises carbon dioxide, but may also comprise ammonia, nitrous oxide, nitric oxide and carbon monoxide. Thus, preferably, the carrier gas of the present invention employed for use with semiconductor materials comprises a mixture of carbon dioxide and nitrogen gas. This carbon dioxide mixture is one example of a carrier gas meeting one requirement of the present invention, that of "pulling" oxygen from the aqueous media through the semi-permeable membrane, while passing an effective pH modifier through the membrane in an opposite direction.

The carrier gas can provide further functions. For example, it has been observed that gas entrained in the aqueous media provides a more efficient coupling of agitation energy, such as sonic energy, including energy at ultrasonic and megasonic (i.e., megahertz) frequency regimes. As pointed out above, dissolved oxygen can be a poor choice for agitation enhancement. However, with the present invention, a benign gas can be dissolved in the aqueous media, upon its passage through the osmotic membrane.

Once in solution with the aqueous media, the carbon dioxide emerging through the membrane removes $OH^-$ shown in the above equations, and especially Equation 3. However, unlike carbon dioxide sparging or bubbling, potentially contaminating particles are not introduced into the wafer-contacting aqueous media. Further advantages over sparging techniques are also made possible by the present invention. For example, by passing through the semi-permeable membrane of the present invention, carbon dioxide is introduced into the aqueous media in a finer, i.e., physically smaller, form. Accordingly, carbon dioxide is more completely dissolved in the aqueous media and is more quickly and thoroughly mixed. Further, with the present invention, carbon dioxide is introduced into the aqueous media quiescently, without bubbles. In addition to slowing or otherwise impairing dissolving of the encapsulated $CO_2$ gas, bubbles introduced by sparging or the like bubbling technique might be carried to the wafer surface to form an effective barrier, at least partly blocking intimate contact of the wafer surface with the treating solution.

In order to provide a wide range of control of pH values, the preferred carrier gas, as mentioned, comprises a mixture of carbon dioxide and a diluent, such as nitrogen gas, which allows the oxygen transfer rate to continue across the membrane while holding the aqueous media pH value at a constant level. As can be seen from the above, the $CO_2$ gas is introduced into the aqueous media to provide pH control. The present invention also contemplates the introduction of chemicals passing through the osmotic membrane to achieve desired objectives other than pH control. For example, a desired surfactant may be introduced in liquid or gaseous form in the carrier stream and, upon passing through the osmotic membrane, will be quiescently added to the aqueous media. If desired, additional control may be provided by employing other, conventional pH control methods directly in the process chamber. For example, a carrier gas mixture of 4% hydrogen gas and 96% nitrogen gas can be used to provide a more reducing environment, which is less likely to permit corrosion. As a further example, an injection apparatus can be provided within cavity 34 to introduce a buffer or ion exchange solution. Optionally, an acid or base drip can be added to one of the lids covering the cavity.

In addition to the above equations, consideration is also given to the increasing use of copper and copper alloys as structures layered on semiconductor substrates. From a device manufacturer's standpoint, increased copper content provides increased conductivity and hence increased speed of electronic operation. The demand for copper content of copper/aluminum alloys is steadily increasing and it is possible that metal lines formed on semiconductor substrates may be comprised entirely of copper metal. As is well known, even small percentages of copper undergo substantial corrosion when contacted with water containing dissolved oxygen. When such small amounts of copper (components greater than 1% of the total alloy) are added to aluminum, an observed galvanic reaction between copper and aluminum operates to seriously increase the corrosion rate of the aluminum component.

$$3Cu_{(s)} + Al_{(s)} \rightarrow Cu^{\delta-} Al^{\delta+} \qquad \text{(Equation 5)}$$

Once the aluminum component becomes positively charged, the electrons are attracted in the p-orbital of the rinse water $O_2$ molecule. By effectively removing dissolved oxygen from the aqueous media, the present invention eliminates these types of corrosion reactions.

It has also been observed in carrying out the present invention, that the corrosion reaction rate displays photochemical sensitivity. Attempts to quantify the photoreactivity of the various corrosion reactions have not been studied in detail, but even so, the observed photoreactivity role is pronounced in conventional semiconductor cleaning operations. The process chamber 12 is constructed such that the interior of receptacle 26 is sealed in a light-tight as well as an air-tight condition, using lids which carry out multiple functions beyond merely blocking ambient light.

As mentioned above, wafers 22 to be processed may be sprayed, but are preferably immersed in solution contained within receptacle 26. This provides several advantages. Due to the chemical sensitivity of materials employed, and ever tightening constraints on process parameters, management of so-called "backside" wafer contamination is becoming increasingly important if wafer losses are to be controlled. By providing an immersion cleaning of wafers 22, issues of backside contamination are eliminated in a cost effective rapid manner, since all exposed surfaces of the wafer are cleaned simultaneously.

Further, with the present invention, dislodged particles are managed with greater control so as to prevent their re-introduction on the wafer surface. For example, referring to FIGS. 2 and 4, tanks 110, 112 are located adjacent process chamber 12 and are coupled to the process chamber with a plurality of supply and return lines. Tank 110 is coupled to plenum 46 by a return line 116 and by a supply line 118 which includes a pump 120 and filter 122. A second return line 124 couples tank 110 to weir outlet 38. Tank 112 is connected to plenum 46 through return line 126 and through supply line 128 associated with pump 130 and filter 132. A second return line 134 couples tank 112 to weir outlet 38. Tanks 110, 112 have supply inlets 140, 142 to a bulk chemical source (not shown).

Figure 4:
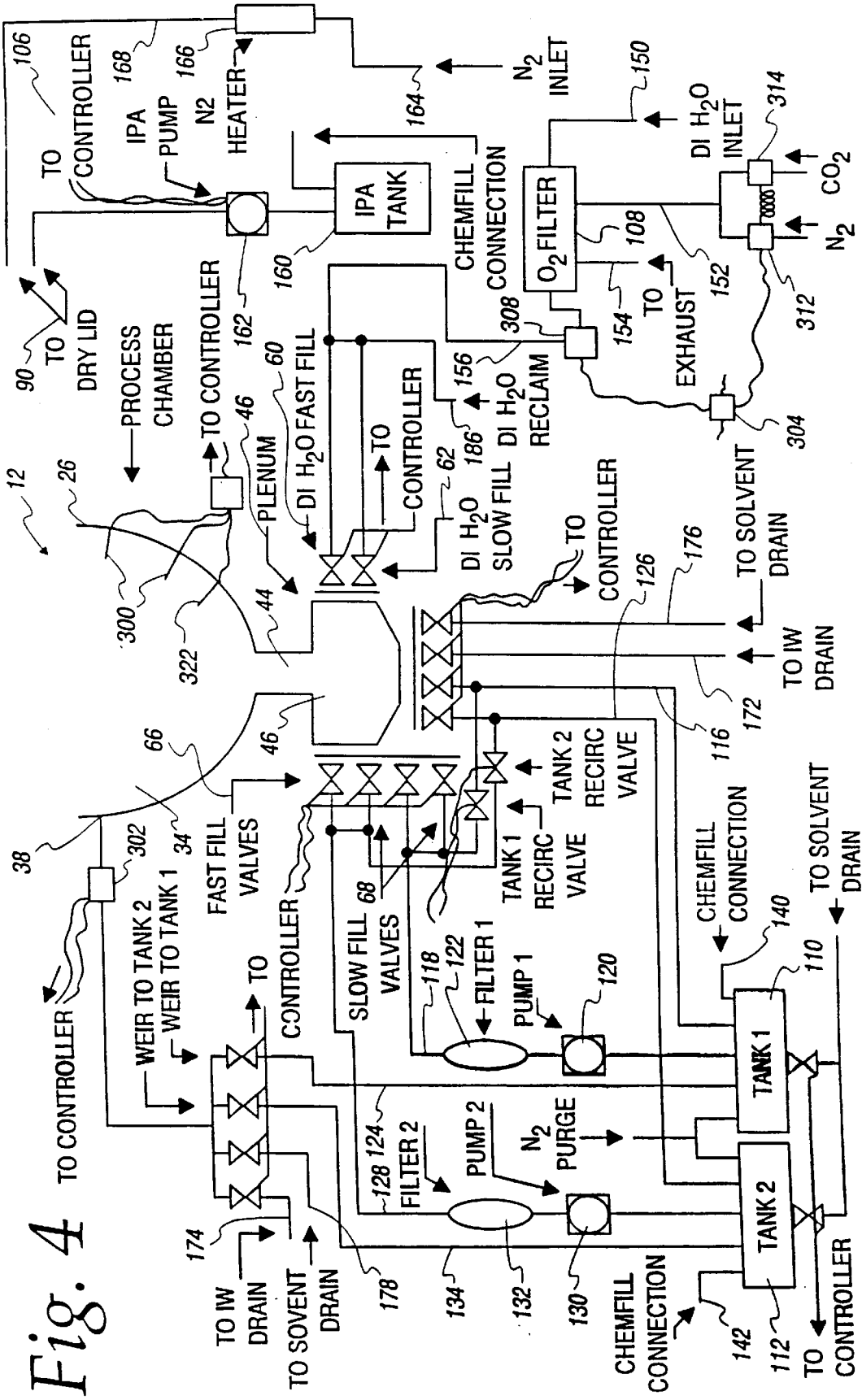
FIG. 4 is a schematic diagram thereof.

Referring to the bottom right corner of FIG. 4, a deionized water inlet 150 and a carbon dioxide mixture inlet 152 are provided for the osmotic membrane degasifier 108. The carbon dioxide mixture or other carrier gas entering inlet 152 passes across the membrane internal to degasifier 108 and exits through exhaust 154. A portion of the carrier gas, along with the water introduced by inlet 150, exits through line 156 which is coupled to valves 60, 62. Preferably, inlets 150, 152 include temperature control (e.g., heating) capability coupled to controller 304. In addition to providing control of the aqueous media in cavity 34, heating control at inlets 150, 152 controls the diffusion rates and bi-directional selectivity of the osmotic membrane.

Referring to the upper right-hand portion of FIG. 4, drying equipment 106 includes a rinse agent tank 160 and a pump 162 which are coupled to assembly 92 mounted in lid 90. As mentioned, the rinse agent preferably comprises isopropyl alcohol. The drying gas, preferably $N_2$, enters through inlet 164 and is heated in heater 166, thereafter being conducted through line 168 to assembly 92 in lid 90.

As noted above, it is preferred that all wafer-contacting chemistries are introduced into cavity 34 from plenum 46. In this arrangement, points of entrapment are eliminated as are direct chemical connections to receptacle 26, thereby avoiding the attendant possibility of mis-operation. As will be seen below, it is generally preferred that cavity 34 be operated as a recirculating immersion process chamber as well as an overflow immersion rinse bath. Although not preferred for the treatment of semiconductor wafers, cavity 34 can be operated in a spray contact or waterfall mode, with conventional nozzles located in the interior of cavity 34 and/or the lids associated therewith.

As can be seen from the above description of FIG. 4, several recirculation loops are provided with the arrangement of the present invention and it is contemplated that the treatment apparatus may comprise a totally closed system.

However, it may also be advantageous from time to time to discard certain portions of the processing or rinsing agents employed and connections to an industrial waste water drain are provided by line 172 (exiting a manifold at the outlet of plenum 46) and line 174 (coupled to the weir discharge 38). Connections to a separate solvent drain are provided by line 176 exiting plenum 46 and line 178 coupled to tank weir outlet 38.

As will be appreciated from the foregoing, chamber 12 can be operated in a number of different ways. For example, wafer treatment can be limited to post solvent wafer rinse. However, it has been found unnecessary to perform residue-removing solvent cleaning at a separate location. Rather, residue is preferably removed from the wafer using solvent in chamber 12, followed by a solvent-removing rinse and concluding with a wafer drying operation. Initially, cavity 34, passageway 44 and plenum 46 are emptied, cleared of all liquids. If desired, a purge gas can be employed, filling the cavity, passageway and plenum.

In preparation for a wafer transport operation, load lid 94 is opened and one or more wafers 22 are inserted in cavity 34, so as to rest on furniture supports 42. In an optional pre-treating step, the empty plenum 46 is then filled with a first solvent solution, preferably taken from tank 110 and passed through filter 122. Solvent is introduced so as to eventually fill plenum 46, passageway 44 and the interior or cavity of receptacle 26. Tank 110 preferably contains used solvent, captured from a previous secondary solvent cleaning operation, as will be seen herein. This initial contact with the wafer causes the highest concentration of residue and contaminating particles to enter into solution within cavity 34. It is anticipated that, in many commercial operations, this initial pre-treatment solution will be discarded. Depending upon the flow conditions within cavity 34, the initial pre-treating solution may also exit cavity 34 through overflow weir 38. Alternatively, cavity 34, passageway 44 and plenum 46 may be drained by line 176.

In certain instances, the pre-treatment operation may be unnecessary, in which case pump 120 is energized so as to withdraw used solvent from tank 110, which, after exiting filter 122, fills plenum 46 and ultimately cavity 34. After a sufficient period of ultrasonic agitation, the solvent is either returned to tank 110 through line 116 or is discharged to the solvent drain through line 176. It is generally preferred during all stages of wafer cleaning that wafer 22 be maintained fully immersed and further that cavity 34 be filled so as to cause a controlled overflow through weir 38. Overflow solvent can be returned to tank 110 through line 124 or the overflow can be discharged to solvent drain through line 178.

If desired, conventional particle counters 300 (see FIG. 4) such as those commercially available from Particle Measuring Systems (PMS) located at Boulder, Colo. can be employed to monitor contents of cavity 34 to aid in the decision whether to retain or discard the overflow and/or the cavity contents. Alternatively, conventional chemical monitoring systems 302 may be coupled to controller 304, to sample the weir overflow to detect the presence or concentration of a residue component in order to provide information to controller 304 indicating the real time concentration of residue in solution. Such indications can be used to detect when rinsing of solvent is complete. According to the concentrations of residue indicated, the overflow residue can, under operation in controller 304, be either retained in tank 110 or discarded. Output indications can also control any amount of contamination-diluting fresh chemistry that may be added to tank 110 through line 140.

At the conclusion of the first cleaning stage, with the reused solvent being withdrawn from the plenum 46 and tank cavity 34, "cleaner" solvent in tank 112 is passed through pump 130 and filter 132 to plenum 46 and the level is allowed to rise, filling cavity 34, fully immersing wafer 22 and causing a controlled overflow through weir outlet 38. Weir overflow may be returned through line 134 to tank 112 or may be discharged to a solvent drain through line 178. At the conclusion of the second stage of wafer cleaning, the wafer may be immersed, sprayed, washed or otherwise "reused" with virgin solvent from a bulk supply. The tank cavity passageway 44 and plenum 46 are then drained of all solvent. The solvent is preferably returned to tanks 110 and/or 112 through lines 116, 126 but may be discharged to a solvent drain through line 176, if desired.

Thereafter, wafer 22 is rinsed with an aqueous rinse solution to remove solvent from the wafer surface, wafer cavities and other structures carried on the wafer substrate. An aqueous media such a deionized water is processed in osmotic membrane degasifier 108, as described above. A flow of deionized water enters through inlet 150 and a flow of carbon dioxide carrier gas enters the degasifier through inlet 152. Oxygen enriched carrier gas exits degasifier 108 through line 154 and the oxygen-depleted, pH-balanced deionized water exits degasifier 108 on line 156. The aqueous solution, thus treated, may be stored on site, if desired. Preferably, however, the aqueous solution is used on demand, as needed. As with other solutions contacting the device being treated, the modified deionized water fills plenum 46, passageway 44 and cavity 34, immersing wafer 22. Preferably, a controlled overflow is maintained through weir opening 38, being directed through a manifold coupled to exit line 174, thereby being passed to an industrial waste water drain. If desired, overflow can be filtered and redirected through pumping (not shown) to a deionized water reclaim inlet 186, although this has been found to be unnecessary due to the cost efficiencies of employing deionized water as a rinse agent.

Figure 5:
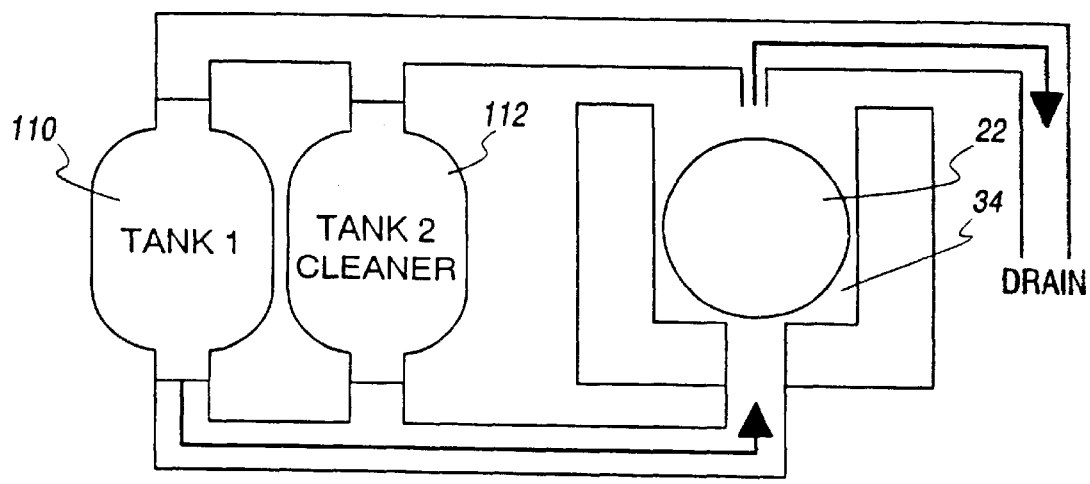
FIGS. 5–8 show a sequence of operation.

Turning now to FIGS. 5–8, the preferred solvent exposure will be briefly considered. FIG. 5 shows an initial wafer contacting operation in which reused solvent from tank 110 fills cavity 34. This initial contact with the wafer contains the majority of dissolved polymer, with polymer concentrations substantially higher than those found in tank 110. Accordingly, it may be desired to discharge the initial contacting solvent to the solvent drain as indicated. Thereafter, the overflow solvent is recirculated back to tank 110 and preserved for reasons of economy. If desired, the solvent could also be directed to a suitable solvent drain.

Figure 6:
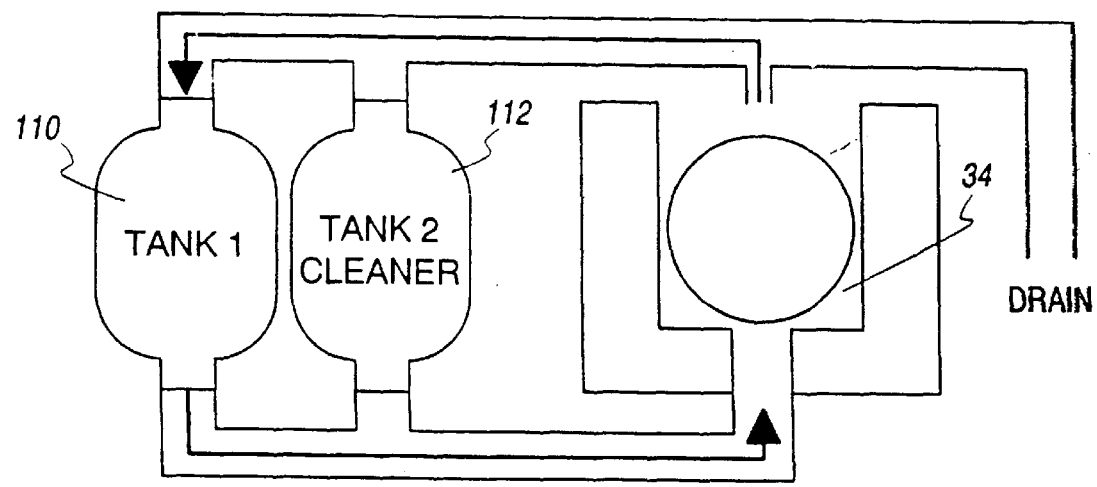

Although the solvent represented in FIG. 6 is reused and therefore contains certain concentrations of dissolved residues, the concentrations of residue are relatively small compared to the concentrations obtained upon initial wafer contact as considered above with reference to FIG. 5. It is generally preferred that most, if not all, of the residues on the wafer be removed in the step indicated in FIG. 6, i.e., with reused solvent.

Figure 7:
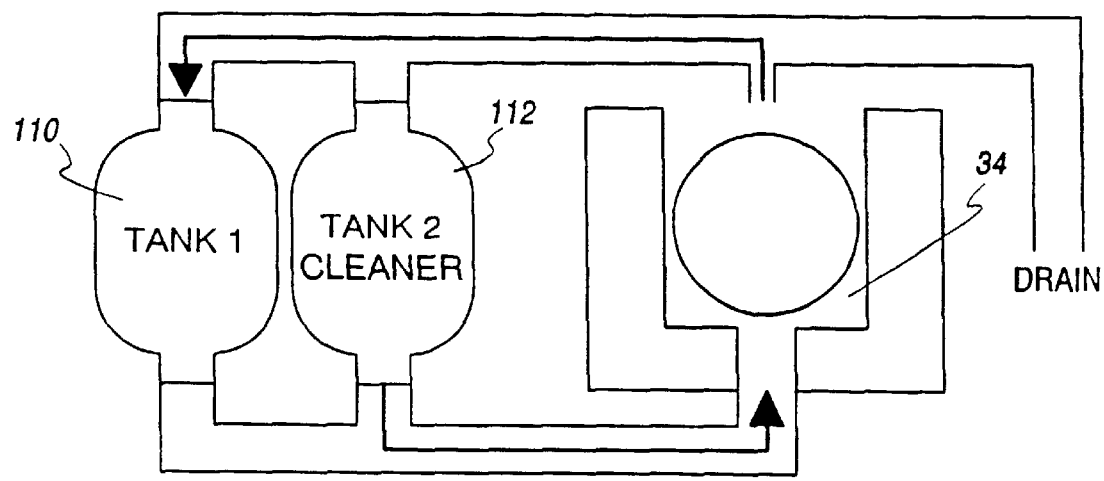

Only after the residues are removed from the surface of the wafer being treated is cleaner solvent applied to the wafer, as indicated in FIG. 7. Use of fresh solvent eliminates the possibility of dropping dissolved polymer residue out of solution or interrupting the suspension of polymer in solvent which is not yet filtered. The preferred purpose of introducing cleaner solvent from tank 112 is to remove dirty solvent prior to recirculating the chemistry. As indicated in FIG. 7, it is preferred to capture the "cleaner" solvent from tank 112 in tank 110, for use on the next cleaning cycle.

As will be appreciated, the chemistry now present in contact with the wafer is cleaner than conventional dual tank bench configurations, because the volume within the tank is continually topped off with fresh chemistry from a bulk source. As can be seen from the diagram of FIG. 4, it is also possible to use virgin solvent chemistry exclusively, prior to the aqueous rinse step.

Figure 8:
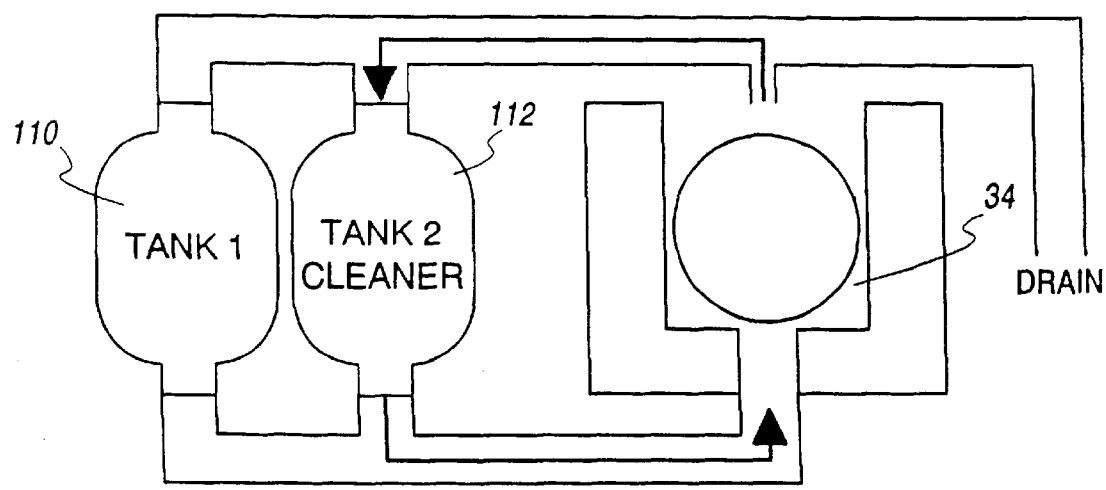

Referring to FIG. 8, as a final solvent cleaning step, fresh, unused solvent is introduced and recirculated with respect to tank 112. It is preferred that solvent filling the cavity, passageway and plenum are returned to tank 112 for future use. Thereafter, the aqueous rinse and drying steps described above are carried out. During this time, tank 112 is "topped off" from a bulk solvent source, if desired. As will be appreciated, fresh solvent introduced into tank 112 will have benefit of a substantial residence time for any desired mixing, heating, or other temperature control prior to its application in a subsequent process cycle.

In order to maintain the proper chemical component ratios of the solvent as long as possible, the present invention allows the cleaning step to be carried out with a minimum exhaust and purge, which might otherwise cause a loss of quality or quantity of solvent due to evaporation or decomposition associated with oxygen and water content in surrounding air. Thus, as can be seen, the present invention provides improved chemistry management by controlling the chemistry environment during a cleaning operation.

As has been noted above, certain variations and alternative arrangements are possible with the methods and apparatus according to the principles of the present invention. If desired, other alternative arrangements can also be readily employed with the present invention, using conventional equipment and techniques. For example, operation of the osmotic membrane degasifier 108 can be automated using conventional techniques so as to minimize consumption of carrier gas. For example, as mentioned, it is preferred that a mixture of carbon dioxide and nitrogen gas be used for the carrier, at a flow rate which assures adequate diffusion rates of oxygen across the membrane.

If desired, conventional metering 308 to sense dissolved oxygen can be provided on line 156 and the flow rates of the carrier gas at inlet 152 can be adjusted with control signals applied to $N_2$ and $CO_2$ flow controllers 312, 314, respectively. For example, if objectionable oxygen levels are detected in line 156, the flow rate of carrier gas can be increased in order to increase osmotic pressure, thereby withdrawing higher rates of dissolved oxygen from incoming aqueous solution. On the other hand, if dissolved oxygen content in line 156 is sufficiently low, it may be possible to reduce the input flow of one or more carrier gas components and still achieve the desired levels of oxygen removal in line 156.

Further, related variations are also possible. For example, the carbon dioxide and nitrogen components of the carrier gas can be mixed as needed and fed into inlet 152. Conventional pH meters can be incorporated in metering 308 to sense the pH of aqueous media in line 156 and the $CO_2$ component of the carrier gas can be adjusted by operation of flow controller 314 to attain the desired pH level. Any undesired reaction in osmotic pressure (needed to remove dissolved oxygen) can be effectively dealt with by independently adjusting the nitrogen gas flow component (by signals to low controller 312), since both carbon dioxide and nitrogen gas components of the carrier gas are effective in maintaining the desired osmotic pressure needed for effective oxygen removal from the aqueous solution in degasifier 108. If desired, the pH monitoring output and dissolved oxygen monitoring outputs from metering 308 can be considered together either by an operator or more preferably by computer controlled automation 304 to vary the flow rates of the components of carrier gas entering inlet 152. Of course, such automated control could operate to prevent aqueous media in line 156 from entering process chamber 12 if the dissolved oxygen and/or pH levels exceed predefined control points.

As mentioned above, particle counters 300 and chemical monitoring sensors 322 of predictors indicating the concentration of dissolved residue can be employed in cavity 34 or in the effluent of overflow exiting weir 38. As indicated in the above discussion, it is contemplated that automated control attention be given to the varying concentrations of contaminant particles and residue levels in cavity 34, and that control steps be taken to segregate (preferably discard) materials containing unacceptably high concentrations of contaminant particles and/or dissolved residue.

Contaminant levels (either particles or dissolved residue) can be estimated based on their residence time in contact with the wafer or other workpieces immersed within cavity 34. For example, consideration is given to the fact that the material filling cavity 34 be inputted in the plenum 46 at a rate so as to assure a desired rate of overflow passing through overflow weir 38. Overflow materials initially appearing at weir 38 can, for an initial period of time, be diverted away from a recirculation loop or storage container and thus be prevented from coming into contact with lesser-contaminated solution.

However, using conventional automation techniques, greater efficiencies can be obtained by directly monitoring the contamination levels within cavity 34 and/or effluent from overflow weir 38. Particle counters and/or automated chemical monitors of dissolved residue can be employed to provide a more efficient use of solution by preventing the unnecessary disposal of solution initially contacting the wafer surface. In this manner, greater flexibility of operation is possible and wafers of differing compositions and surface properties can be accommodated with a single routine production schedule.

Further, with the introduction of automated metering and other controls, it may be possible to consider a refurbishing of treatment materials employed in the process chamber. For example, decisions can be made based upon the contaminant levels (either particles in solution or dissolved chemistries) as to whether it is cost effective to attempt to reclaim the solution in question. For example, it may be observed that solvents and rinse solutions contain acceptable levels of chemical components, but unfortunately carry unacceptably high levels of contaminant particles. The solutions in question can be directed through conventional filtering equipment and retested to certify their acceptability for re-introduction in subsequent processing stages. It may also be possible to perform the same reclamation, by chemically treating the solution in question so as to remove or reduce unwanted dissolved chemistries.

Automated instrumentation can also take into account the need for make-up of solutions flowing through tanks 110 or 112, for example. Calculations can be made as to the net effect on ultimate contaminate levels and it may be possible from time to time to prevent the unnecessary discarding of process solutions by diluting with fresh chemistries, thereby providing savings relating not only to the cost of replacement solutions but also of waste handling. It will be appreciated by those skilled in the art that such automated instrumentation can be provided using conventional techniques, in a space-efficient manner which would not contribute considerably to the space requirements for the processing equipment.

It will be readily appreciated by those skilled in the art that the oxygen filter (e.g., osmotic membrane degasifier), along with optional automated controls, can be used in stand-alone mode to provide a stored quantity of treated aqueous material. Further, the oxygen filter can be incorporated in arrangements other than those shown herein. For example, conventional wafer polishing operations can benefit from the incorporation of the oxygen filter according to principles of the present invention, and it will be appreciated in this regard that substantial reduction of wafer handling is thereby made possible. If desired, further advantages may be obtained by combining the oxygen filter and process chamber of the present invention, incorporating the combination, for example, in existing wafer processing operations.

If desired, variations in the process chamber are also contemplated by the present invention. As mentioned above, wafer processing benefits from a light-tight closed environment and a flexibility of operation and reduction in wafer handling has been achieved by incorporating a plurality of different lid arrangements with a common receptacle. It is possible, however, to adapt the receptacle for continuous, rather than batch operations. For example, a conveyor belt can be made to pass through the process receptacle and can include depressed portions for immersing articles carried on the conveyor belt beneath fluid levels maintained within the receptacle. Such arrangements may be particularly attractive for photographic operations, for example.

The drawings and the foregoing descriptions are not intended to represent the only forms of the invention in regard to the details of its construction and manner of operation. Changes in form and in the proportion of parts, as well as the substitution of equivalents, are contemplated as circumstances may suggest or render expedient; and although specific terms have been employed, they are intended in a generic and descriptive sense only and not for the purposes of limitation, the scope of the invention being delineated by the following claims.

What is claimed is:

1. A method for treating a workpiece with an aqueous solution, comprising:
    providing a carrier fluid comprising at least one component;
    passing said aqueous solution and said carrier fluid through an osmotic membrane degasifier having a membrane, so as to draw oxygen from said carrier fluid and to introduce at least one component of said carrier fluid into said aqueous solution so as to control the pH of said aqueous solution;
    providing a treatment chamber;
    at least partly filling said treatment chamber with said aqueous solution from said osmotic membrane degasifier; and
    at least partly immersing said workpiece in said aqueous solution.

2. The method of claim 1 wherein said carrier fluid includes carbon dioxide.

3. The method of claim 1 further comprising the steps of:
    providing a treatment chamber defining a cavity for receiving the workpiece;
    inserting the workpiece into the cavity; and
    filing the cavity with said aqueous solution so as to immerse said workpiece in said aqueous solution.

4. The method of claim 3 further comprising the steps of:
    providing a plenum defining a mixing chamber coupled to said treatment chamber; and
    the step of filling the cavity with said aqueous solution comprises the step of passing aqueous solution through said mixing chamber prior to entering said cavity.

5. The method according to claim 3 further comprising the step of sealing said cavity with a light-tight cover.

6. The method according to claim 3 further comprising the step of enclosing the cavity with a heated cover.

7. The method according to claim 3 further comprising the step of enclosing the cavity with a cover and introducing a gas blanket in said cavity.

8. The method according to claim 7 wherein said gas blanket is at least partly comprised of carbon dioxide.

9. The method according to claim 3 further comprising the step of providing a cover to enclose said cavity and injecting a rinse agent from said cavity into said treatment chamber.

10. The method according to claim 3 further comprising the steps of providing a cover to enclose said cavity, emptying said cavity, and directing a drying gas from said cover into said treatment chamber.

11. The method of claim 1 further comprising the step of agitating the aqueous solution to enhance the treatment of workpieces therein.

12. The method according to claim 11 wherein said agitating step comprises exciting said aqueous solution with an ultrasonic frequency.

13. The method according to claim 11 wherein said agitating step comprises exciting said aqueous solution with sonic energy in the megahertz frequency range.

14. The method according to claim 1 further comprising the step of providing an overflow weir in said treatment chamber and filling said treatment chamber with said aqueous solution so as to overflow a portion of said aqueous solution through said weir.

15. The method according to claim 14 further comprising the steps of providing a storage tank and coupling the flow from said weir to said storage tank.

16. The method according to claim 1 further comprising the step of monitoring the oxygen content of said aqueous solution from said osmotic membrane degasifier.

17. The method according to claim 16 further comprising the step of controlling the flow of carrier fluid through said osmotic membrane degasifier in response to the oxygen level sensed in said aqueous solution from said osmotic membrane degasifier.

18. The method according to claim 16 wherein the step of providing a carrier fluid comprises the step of providing a plurality of carrier fluid components and mixing said carrier fluid components together to form said carrier fluid.

19. The method according to claim 18 wherein the step of controlling the flow of carrier fluid entering said osmotic membrane degasifier comprises the step of individually controlling the carrier fluid components which are mixed together to form said carrier fluid.

20. The method according to claim 1 wherein said step of contacting the workpiece with said aqueous solution from said osmotic membrane degasifier comprises immersing the workpiece in said aqueous solution.

21. The method according to claim 1 wherein said step of contacting the workpiece with said aqueous solution from said osmotic membrane degasifier comprises spraying the workpiece with said aqueous solution.

22. The method according to claim 1 wherein said step of contacting the workpiece with said aqueous solution from said osmotic membrane degasifier comprises passing said aqueous solution over the workpiece.

23. The method of claim 1 further comprising the step of introducing acid into said treatment chamber so as to alter the pH of said aqueous solution.

24. The method of claim 23 wherein said step of introducing acid comprises the step of dripping acid into said treatment chamber.

25. The method of claim 24 further comprising the step of providing a cover connected to said treatment chamber and providing acid drip apparatus connected to said cover for performing the step of dripping acid into said treatment chamber.

26. A method for cleaning opposed major surfaces of a semiconductor device, comprising:
    providing a cleaning chamber defining a cavity or receiving the semiconductor device;
    inserting the semiconductor device into the cavity;

filling the cavity with a first solvent so as to immerse said semiconductor device in said first solvent while exciting said chamber with ultrasonic energy so as to transmit said ultrasonic energy through said first solvent to said semiconductor device;

emptying said cavity of said first solvent;

filling the cavity with a second solvent so as to immerse said semiconductor device in said second solvent while exciting said chamber with ultrasonic energy so as to transmit said ultrasonic energy through said second solvent to said semiconductor device;

emptying said cavity of said second solvent;

providing an aqueous solution;

providing a carrier fluid containing carbon dioxide passing said aqueous solution and said carrier fluid through an osmotic membrane degasifier having a membrane, so as to draw oxygen from said aqueous solution through said membrane to said carrier fluid and so as to introduce carbon dioxide gas through said membrane, into said aqueous solution so as to control the pH of said aqueous solution filling the cavity with a aqueous solution from said osmotic membrane degasifier so as to immerse said semiconductor device in said aqueous solution while exciting said chamber with ultrasonic energy so as to transmit said ultrasonic energy through said aqueous solution to said semiconductor device;

emptying said cavity of said aqueous solution:

drying the major surfaces of conductor device; and removing said semiconductor device from said cavity.

27. The method of claim 26 wherein said step of drying the said semiconductor device comprises the step of passing heated fluid over the surfaces of said semiconductor device.

28. The method of claim 26 wherein said step of drying said semiconductor device further comprises the step of spraying a rinse agent on the major surfaces of said semiconductor device.

29. The method according to claim 26 further comprising the steps of:

providing a process cover with heater means for heating the process cover;

providing a drying cover with means for directing a stream of drying gas;

providing said cleaning chamber with a device opening through which said semiconductor device is passed into and out of said cavity;

covering said device opening with said process cover during rinsing of said semiconductor device; and withdrawing said process cover from said device opening and covering said device opening with said drying cover during cleaning of said semiconductor device.

30. The method of claim 26 further comprising the steps of:

providing a plenum defining a mixing chamber coupled to said treatment chamber; and the step of filling the cavity with said aqueous solution comprises the step of passing aqueous solution through said mixing chamber prior to entering said cavity.

31. The method according to claim 26 further comprising the step of sealing said cavity with a light-tight seal.

32. The method according to claim 26 further comprising the step of enclosing the cavity with a heated lid.

33. The method according to claim 30 further comprising the step of withdrawing at least a portion of said first solvent from said cavity and passing said withdrawn portion of said first solvent through said mixing chamber for reintroduction into said cavity.

34. The method according to claim 30 further comprising the step of withdrawing at least a portion of said second solvent from said cavity and passing said withdrawn portion of said second solvent through said mixing chamber for reintroduction into said cavity.

35. The method according to claim 30 further comprising the step of withdrawing at least a portion of said aqueous solution from said cavity and passing said withdrawn portion of said aqueous solution through said mixing chamber for reintroduction into said cavity.

36. The method according to claim 26 further comprising the step of providing an overflow weir in said treatment chamber and filling said treatment chamber with said aqueous solution so as to overflow a portion of said aqueous solution through said weir.

37. The method according to claim 36 further comprising the steps of providing a storage tank and coupling the flow from said weir to said storage tank.

38. The method according to claim 26 further comprising the step of monitoring the oxygen content of said aqueous solution from said osmotic membrane degasifier.

39. The method according to claim 38 further comprising the step of controlling the flow of carrier fluid through said osmotic membrane degasifier in response to the oxygen level sensed in said aqueous solution from said osmotic membrane degasifier.

40. The method according to claim 39 wherein the step of providing a carrier fluid comprises the step of providing a plurality of carrier fluid components and mixing said carrier fluid components together to form said carrier fluid.

41. The method according to claim 40 wherein the step of controlling the flow of carrier fluid entering said osmotic membrane degasifier comprises the step of individually controlling the carrier fluid components which are mixed together to form said carrier fluid.

42. The method according to claim 26 wherein said step of contacting the workpiece with said aqueous solution from said osmotic membrane degasifier comprises immersing the workpiece in said aqueous solution.

43. The method according to claim 26 wherein said step of contacting the workpiece with said aqueous solution from said osmotic membrane degasifier comprises spraying the workpiece with said aqueous solution.

44. The method according to claim 26 wherein said step of contacting the workpiece with said aqueous solution from said osmotic membrane degasifier comprises passing said aqueous solution over the workpiece.

45. The method of claim 26 further comprising the step of introducing acid into said treatment chamber so as to alter the pH of said aqueous solution.

46. The method of claim 45 wherein said step of introducing acid comprises the step of dripping acid into said treatment chamber.

47. The method of claim 46 further comprising the step of providing a cover connected to said treatment chamber and providing acid drip apparatus connected to said cover for performing the step of dripping acid into said treatment chamber.

* * * * *